US011424391B2

(12) United States Patent
Chen

(10) Patent No.: US 11,424,391 B2
(45) Date of Patent: Aug. 23, 2022

(54) WAVELENGTH-CONVERTING ELEMENT, PROJECTION APPARATUS, AND MANUFACTURING METHOD OF WAVELENGTH-CONVERTING ELEMENT

(71) Applicant: Coretronic Corporation, Hsin-Chu (TW)

(72) Inventor: I-Hua Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/380,983

(22) Filed: Apr. 10, 2019

(65) Prior Publication Data
US 2019/0378960 A1   Dec. 12, 2019

(30) Foreign Application Priority Data
Jun. 11, 2018   (CN) .......................... 201810594803.2

(51) Int. Cl.
*H01L 33/50* (2010.01)
*G02B 5/02* (2006.01)
(Continued)

(52) U.S. Cl.
CPC .......... *H01L 33/502* (2013.01); *G02B 5/0205* (2013.01); *G02B 27/0977* (2013.01);
(Continued)

(58) Field of Classification Search
CPC ............. G02B 5/0205; G02B 27/0977; G02B 5/0242; H01L 33/502; H01L 33/46;
(Continued)

(56) References Cited

U.S. PATENT DOCUMENTS 9,874,741 B2 *  1/2018  Egawa ................. G03B 21/204
10,642,141 B2 *  5/2020  Jian ...................... G02B 5/0284
(Continued)

FOREIGN PATENT DOCUMENTS

CN       101225942 A    7/2008
CN       100509994 C    7/2009
(Continued)

OTHER PUBLICATIONS

Sino Nano Technology Corporation; Inorganic Nano Binders; Kaohsiung, Taiwan; http://www.nanosino.biz/inorganic%20nano%20system.htm#Product%20Series.

*Primary Examiner* — Savitri Mulpuri

(57) ABSTRACT

A wavelength-converting element includes a substrate, a wavelength-converting layer and a diffuse reflection layer. The wavelength-converting layer is disposed above the substrate. The diffuse reflection layer is disposed between the substrate and the wavelength-converting layer. The diffuse reflection layer includes an inorganic binder and a plurality of diffuse reflection particles. The diffuse reflection particles are mixed with the inorganic binder. The inorganic binder includes an alcohol-soluble inorganic binder or a water-soluble inorganic binder. A projection apparatus using the wavelength-converting element and a manufacturing method of the wavelength-converting element are also provided.

9 Claims, 4 Drawing Sheets

(51) Int. Cl.
    *G03B 21/20* (2006.01)
    *G02B 27/09* (2006.01)
    *H01L 33/46* (2010.01)
    *H01L 33/40* (2010.01)

(52) U.S. Cl.
    CPC ....... *G03B 21/204* (2013.01); *G03B 21/2066* (2013.01); *H01L 33/405* (2013.01); *H01L 33/46* (2013.01)

(58) Field of Classification Search
    CPC .................. H01L 33/405; H01L 33/507; H01L 2933/0041; G03B 21/2066; G03B 21/204
    See application file for complete search history.

(56) References Cited

U.S. PATENT DOCUMENTS

| | | | | |
|---|---|---|---|---|
| 11,106,123 | B2* | 8/2021 | Tsai | B05D 5/063 |
| 2016/0123557 | A1* | 5/2016 | Xu | C09K 11/02 362/84 |
| 2016/0274353 | A1 | 9/2016 | Ando et al. | |
| 2017/0059979 | A1* | 3/2017 | Hsu | G03B 21/204 |
| 2017/0131445 | A1* | 5/2017 | Koyama | B32B 27/30 |
| 2017/0168379 | A1 | 6/2017 | Hashizume | |
| 2019/0377251 | A1* | 12/2019 | Chen | C09K 11/02 |

FOREIGN PATENT DOCUMENTS

| | | |
|---|---|---|
| CN | 102854726 A | 1/2013 |
| CN | 104100933 A | 10/2014 |
| CN | 104861864 A | 8/2015 |
| CN | 103792767 B | 10/2015 |
| CN | 105278225 A | 1/2016 |
| CN | 105322433 A | 2/2016 |
| CN | 105467734 A | 4/2016 |
| CN | 105580144 A | 5/2016 |
| CN | 104595852 B | 8/2016 |
| CN | 106195922 A | 12/2016 |
| CN | 106483746 A | 3/2017 |
| CN | 106716189 A | 5/2017 |
| CN | 107209447 A | 9/2017 |
| CN | 107615113 A | 1/2018 |
| TW | 201608005 A | 3/2016 |
| TW | I524130 B | 3/2016 |
| TW | I577055 B | 4/2017 |
| TW | 201733169 A | 9/2017 |
| TW | 201802566 A | 1/2018 |
| TW | I614917 B | 2/2018 |
| WO | 2016125611 A1 | 8/2016 |

\* cited by examiner

```
┌─────────────────────────────────────┐
│ form a diffuse reflection layer on a │
│ surface of a wavelength-converting  │──S101
│              layer                  │
└─────────────────────────────────────┘
                  │
                  ▼
┌─────────────────────────────────────┐
│ bond the diffuse reflection layer to a│──S102
│ substrate via an intermediate layer │
└─────────────────────────────────────┘
```

FIG. 4

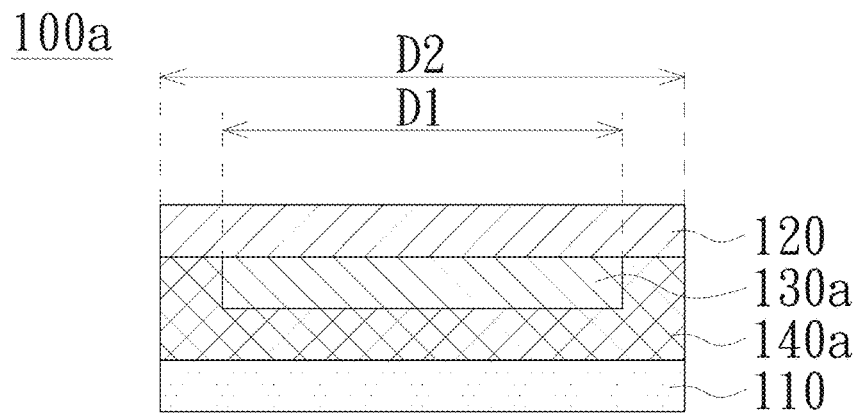

FIG. 5A

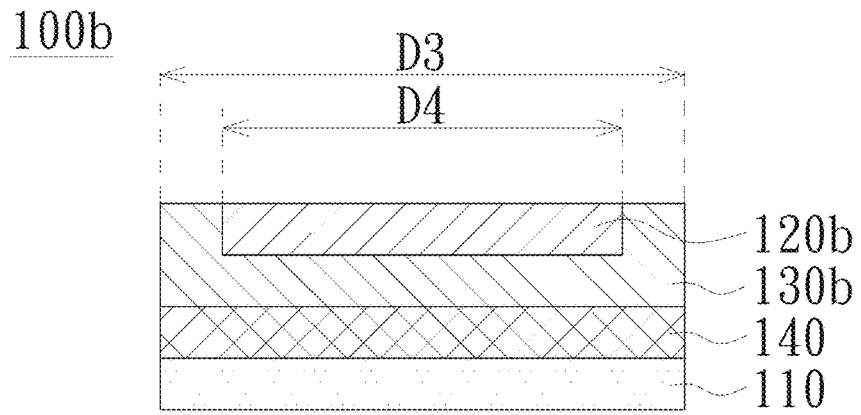

FIG. 5B

WAVELENGTH-CONVERTING ELEMENT, PROJECTION APPARATUS, AND MANUFACTURING METHOD OF WAVELENGTH-CONVERTING ELEMENT

CROSS-REFERENCE TO RELATED APPLICATION

This application claims the priority benefit of china application (CN201810594803.2 filed on 2018 Jun. 2011). the entirety of the above-mentioned patent application is hereby incorporated by reference herein and made a part of this specification.

FIELD OF THE INVENTION

The invention relates to a display apparatus, and more particularly to a wavelength-converting element, a projection apparatus using the same, and a manufacturing method of the wavelength-converting element.

BACKGROUND OF THE INVENTION

With the market requirements for projection apparatus in brightness, color saturation, service life, non-toxic environmental protection, etc., the type of a light source used in a projection apparatus is evolved from a UHP lamp, a light emitting diode (LED) to a laser diode (LD).

At present, the cost of high-brightness red laser diodes and green laser diodes is too high. In order to reduce the cost, a blue laser diode is used to excite the phosphor on the phosphor wheel to generate yellow light and green light, and then the desired red light is filtered out by a filter wheel. With the blue light emitted by the blue laser diode, the three primary colors of red, green and blue required for the projected image are formed.

The phosphor wheel is an extremely important component in projection apparatuses that currently use laser diodes as a light source. However, the phosphor powder layer of the conventional phosphor wheel uses highly transparent silica gel mixed with phosphor powder. Since the highly transparent silica gel has poor thermal conductivity and low temperature resistance, it cannot satisfy the demand of a high-power laser projection apparatus. In addition, in a conventional phosphor wheel, the diffuse reflection material needs to be cured at a high temperature of higher than 400° C. to form a diffuse reflection layer, and the diffuse reflection layer after curing has more pores, which may cause a decrease in the reflectivity of the phosphor wheel.

The information disclosed in this "BACKGROUND OF THE INVENTION" section is only for enhancement understanding of the background of the invention and therefore it may contain information that does not form the prior art that is already known to a person of ordinary skill in the art. Furthermore, the information disclosed in this "BACKGROUND OF THE INVENTION" section does not mean that one or more problems to be solved by one or more embodiments of the invention were acknowledged by a person of ordinary skill in the art.

SUMMARY OF THE INVENTION

The invention provides a wavelength-converting element which can improve reflectivity.

The invention provides a manufacturing method of a wavelength-converting element which can improve the reflectivity of the wavelength-converting element.

The invention provides a projection apparatus which can improve image brightness.

Other objectives and advantages of the invention can be further understood from the technical features disclosed by the invention.

In order to achieve one or partial or all of the above objectives or other objectives, a wavelength-converting element provided by an embodiment of the invention includes a substrate, a wavelength-converting layer and a diffuse reflection layer. The wavelength-converting layer is disposed above the substrate. The diffuse reflection layer is disposed between the substrate and the wavelength-converting layer. The diffuse reflection layer includes an inorganic binder and a plurality of diffuse reflection particles. The diffuse reflection particles are mixed with the inorganic binder. The inorganic binder includes an alcohol-soluble inorganic binder or a water-soluble inorganic binder.

In order to achieve one or partial or all of the above objectives or other objectives, a projection apparatus provided by an embodiment of the invention includes an illumination system, a light valve and a projection lens. The illumination system is adapted to provide an illumination beam. The light valve is disposed on a transmission path of the illumination beam to convert the illumination beam into an image beam. The projection lens is disposed on a transmission path of the image beam. The illumination system includes an exciting light source and a wavelength-converting element. The exciting light source is adapted to provide an exciting beam. The wavelength-converting element is disposed on a transmission path of the exciting beam. A wavelength-converting layer of the wavelength-converting element is adapted to convert the exciting beam into a converted beam. The illumination beam includes the converted beam. The wavelength-converting element includes a substrate, the wavelength-converting layer and a diffuse reflection layer. The wavelength-converting layer is disposed above the substrate. The diffuse reflection layer is disposed between the substrate and the wavelength-converting layer. The diffuse reflection layer includes an inorganic binder and a plurality of diffuse reflection particles. The diffuse reflection particles are mixed with the inorganic binder. The inorganic binder includes an alcohol-soluble inorganic binder or a water-soluble inorganic binder.

In order to achieve one or partial or all of the above objectives or other objectives, a manufacturing method of a wavelength-converting element provided by an embodiment of the invention includes steps of: forming a diffuse reflection layer on a surface of a wavelength-converting layer, wherein the diffuse reflection layer includes an inorganic binder and a plurality of diffuse reflection particles, the diffuse reflection particles are mixed with the inorganic binder, and the inorganic binder includes an alcohol-soluble inorganic binder or a water-soluble inorganic binder; and bonding the diffuse reflection layer to a substrate.

In summary, in the wavelength-converting element of the embodiment of the invention, the diffuse reflection layer includes an inorganic binder and diffuse reflection particles. The inorganic binder includes an alcohol-soluble inorganic binder or a water-soluble inorganic binder. Compared to the curing temperature of the conventional material which needs to be greater than 400° C., the curing temperature of the inorganic binder using the above formula is only 200° C. to 300° C., and therefore the diffuse reflection layer of the embodiment of the invention can reduce the fine pores generated by high temperature (>400° C.) sintering and the characteristics of easily adsorbing liquid, so that the reflectivity of the wavelength-converting element can be improved. Since the manufacturing method of the wavelength-converting element according to the embodiment of the invention uses the inorganic binder, the above-described wavelength-converting element can be manufactured. The projection apparatus according to the embodiment of the invention can increase the image brightness by using the above-described wavelength-converting element.

Other objectives, features and advantages of the invention will be further understood from the further technological features disclosed by the embodiments of the invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIG. 4 is a flow chart showing a manufacturing method of a wavelength-converting element according to an embodiment of the invention;

FIG. 5A is a schematic view of a wavelength-converting element according to another embodiment of the invention;

FIG. 5B is a schematic view of a wavelength-converting element according to still another embodiment of the invention.

DETAILED DESCRIPTION OF PREFERRED EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top", "bottom", "front", "back", etc., is used with reference to the orientation of the Figure(s) being described. The components of the invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the invention. Also, it is to be understood that the phraseology and terminology used herein are for the purpose of description and should not be regarded as limiting. The use of "including", "comprising", or "having" and variations thereof herein is meant to encompass the items listed thereafter and equivalents thereof as well as additional items. Unless limited otherwise, the terms "connected", "coupled", and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
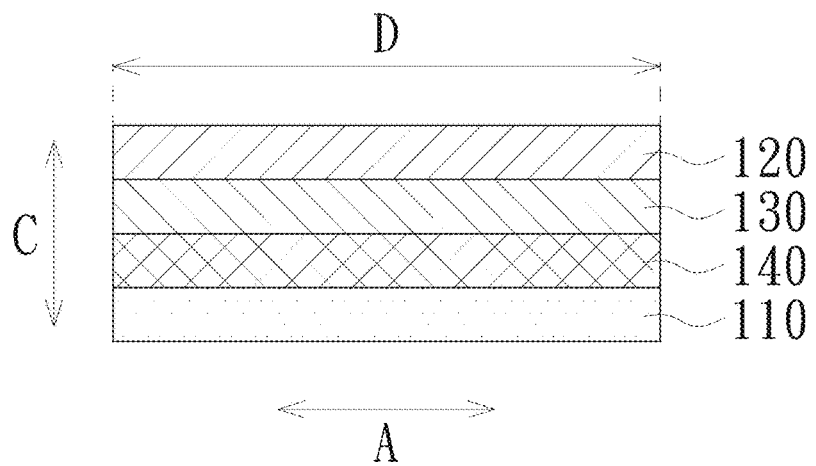
FIG. 1 is a schematic view of a wavelength-converting element according to an embodiment of the invention.

FIG. 1 is a schematic view of a wavelength-converting element according to an embodiment of the invention. Referring to FIG. 1, the wavelength-converting element 100 of the embodiment includes a substrate 110, a wavelength-converting layer 120 and a diffuse reflection layer 130. The wavelength-converting element 100 is, for example, a sheet element, but is not limited thereto. In other embodiments, the wavelength-converting element 100 may also be a wavelength-converting wheel, and the substrate 110 is, for example, a turntable. The wavelength-converting layer 120 is disposed above the substrate 110. The diffuse reflection layer 130 is disposed between the substrate 110 and the wavelength-converting layer 120. The diffuse reflection layer 130 includes, for example, an inorganic binder and diffuse reflection particles, and the diffuse reflection particles are mixed with the inorganic binder. The inorganic binder includes, for example, an alcohol-soluble inorganic binder or a water-soluble inorganic binder, and the curing temperature of the inorganic binder is 200° C. to 300° C.

The material of the substrate 110 is, for example, a metal, but is not limited thereto. The metal includes, for example, aluminum, aluminum alloy, copper, copper alloy, aluminum nitride, silicon carbide, or the like.

The wavelength-converting layer 120 includes, for example, phosphor in glass (PIG), phosphor in ceramic (PIC), polycrystalline fluorescent sheet, monocrystalline fluorescent sheet or phosphor in silicon (PIS), but is not limited thereto.

The component of the alcohol-soluble inorganic binder includes, for example, siloxane and metal oxide. The metal used in the metal oxide is, for example, aluminum, titanium, zirconium, or the like.

The component of the water-soluble inorganic binder includes, for example, at least one of silica sol, phosphate, glass paste and water glass. The properties of the water-soluble inorganic binder are, for example, having a transparent liquid state before curing, having a viscosity less than 1000 cps, and having a light transmittance greater than 90%.

The material of the diffuse reflection particles is, for example, white particles, and includes at least one of titanium oxide, silicon dioxide, aluminum oxide, boron nitride, and zirconium dioxide.

Figure 2:
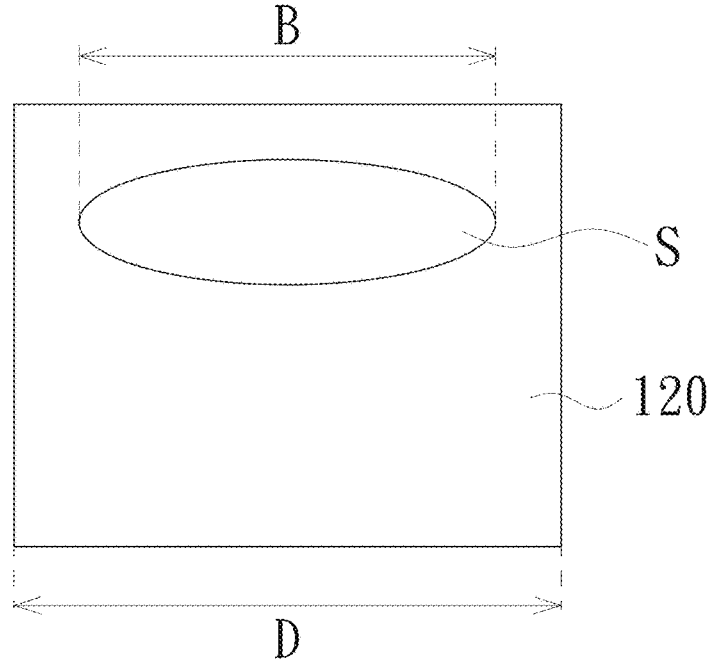
FIG. 2 is a schematic view of a light spot formed by light on a wavelength-converting element according to an embodiment of the invention.

FIG. 2 is a schematic view of a light spot formed by light on a wavelength-converting element according to an embodiment of the invention. Referring to FIGS. 1 and 2, when the wavelength-converting layer 120 and the diffuse reflection layer 130 are disposed on the substrate 110, the width D of the wavelength-converting layer 120 and the width D of the diffuse reflection layer 130 in the direction A parallel to the substrate 110 (in the embodiment, the widths of the wavelength-converting layer 120 and the diffuse reflection layer 130 are the same, so that both use D to represent the width thereof) both need to be greater than the long axis B of the light spot S formed by the light on the wavelength-converting element 100 (in FIG. 2, the uppermost wavelength-converting layer 120 is illustrated), so that light can be irradiated onto the wavelength-converting element 100 and thereby enhancing the utilization of light.

The diffuse reflection layer 130 in the embodiment includes an inorganic binder and diffuse reflection particles. The inorganic binder includes an alcohol-soluble inorganic binder or a water-soluble inorganic binder. The inorganic binder of the above formulation has a hydroxyl group (—OH). During the process of curing and heating, adjacent hydroxyl groups will dehydrate and form bonds at about 200° C. to 300° C. For example, the surface of the colloidal particles of the silica sol in the water-soluble inorganic binder has a large amount of silanol groups (Si—OH). During the heating process, the colloidal particles approach each other, and the adjacent hydroxyl groups in the silanol groups dehydrate to form a —Si—O—Si— bond so as to achieve a curing effect. Compared to the curing temperature of the conventional material which needs to be greater than 400° C., the curing temperature in this manner of the embodiment is only 200° C. to 300° C., and therefore the diffuse reflection layer 130 of the embodiment of the invention can reduce the fine pores generated by high temperature (>400° C.) sintering and the characteristics of easily adsorbing liquid, so that the reflectivity of the wavelength-converting element 100 can be improved. In the embodiment of the invention, the reflectivity of the diffuse reflection layer 130 for light having a wavelength of 400 nm to 700 nm is greater than or equal to 92%.

Figure 3A:
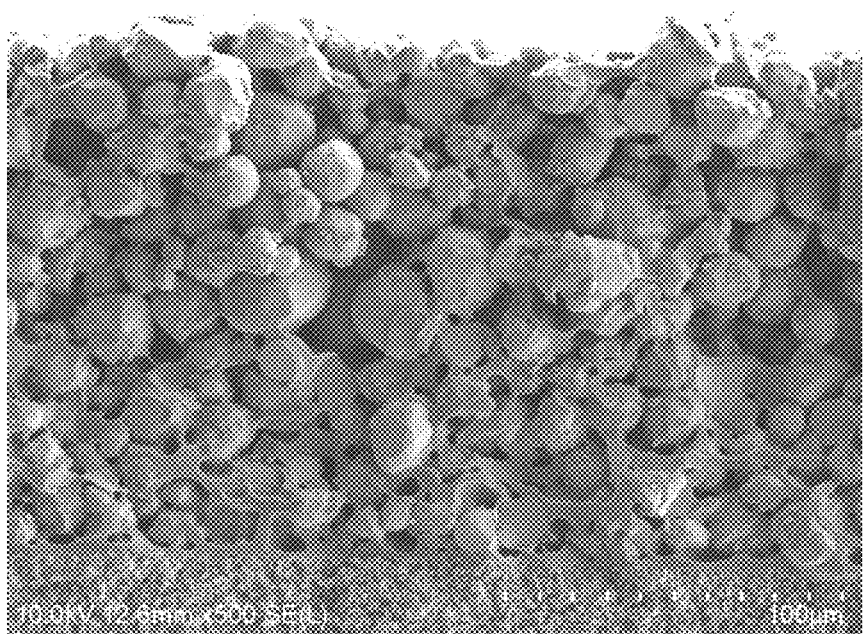
FIG. 3A is a scanning electron microscope (SEM) image of a conventional diffuse reflection layer sintered by high temperature.
Figure 3B:
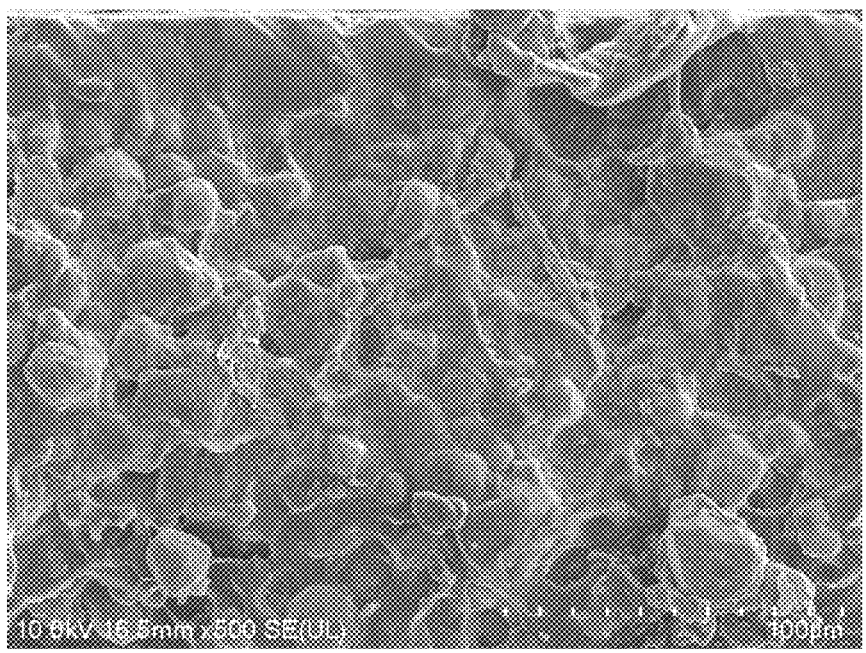
FIG. 3B is a scanning electron microscope image of a diffuse reflection layer according to an embodiment of the invention.

FIG. 3A is a scanning electron microscope (SEM) image of a conventional diffuse reflection layer sintered by high temperature. FIG. 3B is a scanning electron microscope image of a diffuse reflection layer according to an embodiment of the invention. Referring to FIGS. 3A and 3B, comparing the two figures, the diffuse reflection layer 130 of the embodiment has fewer pores than the conventional diffuse reflection layer, so that the light is more easily reflected when it is incident on the diffuse reflection layer 130. Thus, the diffuse reflection layer 130 of the embodiment can increase the reflectivity of the wavelength-converting element 100.

In order to achieve the above-described diffuse reflection effect, the thickness of the diffuse reflection layer 130 in the direction C perpendicular to the substrate 110 is, for example, 0.03 mm to 0.15 mm, and the particle diameter of the diffuse reflection particles is, for example, 5 nm to 500 nm. Further, the percentage by volume of the inorganic binder to the diffuse reflection layer 130 is, for example, 10% to 80%, and the percentage by weight is, for example, 30% to 70%.

FIG. 4 is a flow chart showing a manufacturing method of a wavelength-converting element according to an embodiment of the invention. Referring to FIGS. 1 and 4, the manufacturing method of the wavelength-converting element 100 of the embodiment includes the following steps. First, step S101: forming the diffuse reflection layer 130 on the surface of the wavelength-converting layer 120. Specifically, the diffuse reflection layer 130 is, for example, coated or printed on the surface of the wavelength-converting layer 120, and the diffuse reflection layer 130 is cured at a temperature of 200° C. to 300° C.

Thereafter, step S102: bonding the diffuse reflection layer 130 to the substrate 110. Specifically, the wavelength-converting element 100 further includes, for example, an intermediate layer 140. The diffuse reflection layer 130 is bonded to the substrate 110 by coating or printing the intermediate layer 140 on the surface of the diffuse reflection layer 130.

The material of the intermediate layer 140 includes, for example, silica gel, epoxy resin or thermal conductive adhesive. In order to achieve a better diffuse reflection effect, the thickness of the intermediate layer 140 is, for example, less than or equal to 0.05 mm when silica gel or epoxy resin is used; and the thickness of the intermediate layer 140 is, for example, less than or equal to 0.15 mm when the thermal conductive adhesive is used. Further, the thermal conductivity of the diffuse reflection layer 130 is smaller than or equal to the thermal conductivity of the intermediate layer 140, so that the thermal energy generated by the high energy of the incident light can be conducted by the thermal conductive adhesive to achieve a heat dissipation effect.

When manufacturing the wavelength-converting element 100, the width D of the diffuse reflection layer 130 and the width D of the wavelength-converting layer 120 in the direction A parallel to the substrate 110 may be the same or different. However, in order to achieve a better diffuse reflection effect, the width ratio of the diffuse reflection layer 130 to the wavelength-converting layer 120 is, for example, 0.7 to 1.5. In addition, in the embodiment including the intermediate layer 140, the width D of the intermediate layer 140 in the direction A parallel to the substrate 110 is, for example, greater than the width D of the diffuse reflection layer 130, so that the overall structure of the wavelength-converting element 100 is more stable after the diffuse reflection layer 130 is bonded to the substrate 110. Or, the width D of the intermediate layer 140 in the direction A parallel to the substrate 110 is, for example, greater than the long axis B of the light spot S to achieve a heat dissipation effect. The coating conditions in the different embodiments will be exemplified below.

Referring first to FIG. 1, in the wavelength-converting element 100 of FIG. 1, the width D (hereinafter simply referred to as width) of the wavelength-converting layer 120, the diffuse reflection layer 130 and the intermediate layer 140 in the direction A parallel to the substrate 110 is, for example, the same. FIG. 5A is a schematic view of a wavelength-converting element according to another embodiment of the invention. FIG. 5B is a schematic view of a wavelength-converting element according to still another embodiment of the invention. Referring to FIGS. 5A and 5B, in the embodiment in which the width D1 of the diffuse reflection layer 130a is smaller than the width D2 of the wavelength-converting layer 120 (FIG. 5A), when the intermediate layer 140a is coated on the diffuse reflection layer 130a, the periphery of the intermediate layer 140a may extend to cover both sides of the diffuse reflection layer 130a and is directly coated to the wavelength-converting layer 120 for example, so that the wavelength-converting layer 120 can be more firmly bonded to the substrate 110, and therefore the overall structure of the wavelength-converting element 100a is more stable. In the embodiment in which the width D3 of the diffuse reflection layer 130b is greater than the width D4 of the wavelength-converting layer 120b (FIG. 5B), when the diffuse reflection layer 130b is coated to the wavelength-converting layer 120b, the periphery of the diffuse reflection layer 130b may cover both sides of the wavelength-converting layer 120b, so that the overall structure of the wavelength-converting element 100b is more stable.

Figure 6:
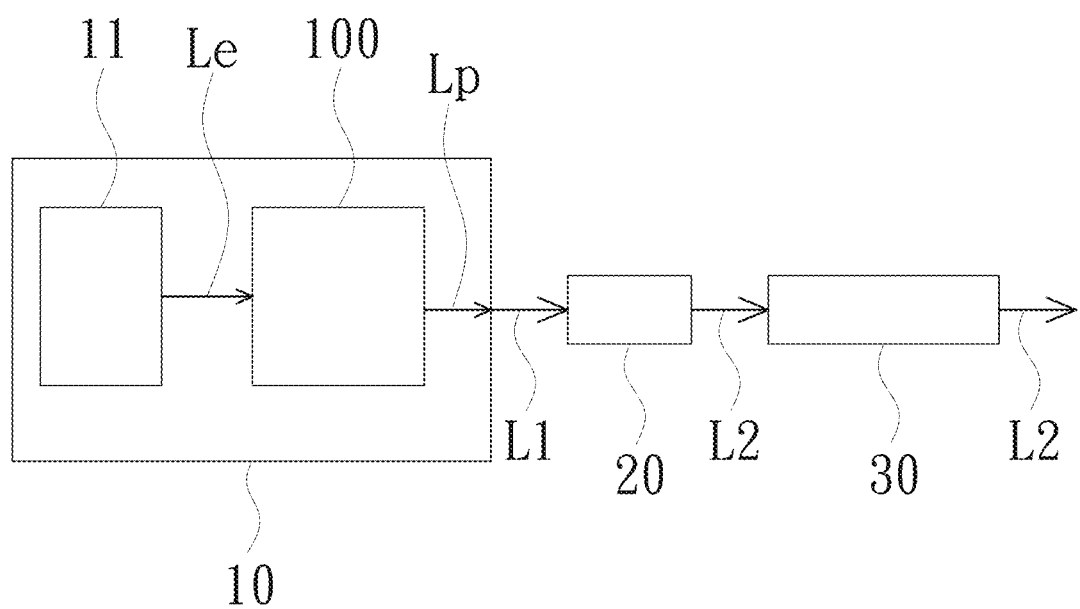
FIG. 6 is a block diagram of a projection apparatus according to an embodiment of the invention.

FIG. 6 is a block diagram of a projection apparatus according to an embodiment of the invention. Referring to FIG. 6, in the embodiment, the wavelength-converting element 100 is, for example, a wavelength-converting wheel, and the substrate 110 is, for example, a turntable. The projection apparatus 1 of the embodiment includes an illumination system 10, a light valve 20 and a projection lens 30. The illumination system 10 is adapted to provide an illumination beam L1. The illumination system 10 includes an exciting light source 11 and the above-described wavelength-converting element 100 (wavelength-converting wheel). The exciting light source 11 is adapted to provide an exciting beam Le. The wavelength-converting element 100 is disposed on the transmission path of the exciting beam Le and includes a wavelength-converting region (not shown). The wavelength-converting region includes the wavelength-converting layer 120 and the diffuse reflection layer 130. The wavelength-converting region of the wavelength-converting element 100 is adapted to convert the exciting beam Le into a converted beam Lp, and the illumination beam L1 includes the converted beam Lp, but is not limited thereto. The illumination system 10 may further include other optical components, such as a light combining element, a filter wheel, a light homogenizing element and a condenser lens, so that the illumination beam L1 can be transmitted to the light valve 20. The light valve 20 is disposed on the transmission path of the illumination beam L1 to convert the illumination beam L1 into an image beam L2. The light valve 20 may be a transmissive light valve or a reflective light valve, wherein the transmissive light valve may be a liquid crystal display panel, and the reflective light valve may be a digital micro-mirror device (DMD) or liquid crystal on silicon panel (LCoS panel). Depending on the structure design, the number of light valves can be one or more. The projection lens 30 is disposed on the transmission path of the image beam L2 to project the image beam L2 out of the projection apparatus 1.

In FIG. 6, the wavelength-converting element 100 in FIG. 1 is taken as an example; however, the wavelength-converting element 100 may be replaced with the wavelength-converting element of any of the above embodiments.

Since the projection apparatus 1 of the embodiment adopts the wavelength-converting element 100, 100a or 100b capable of improving the reflectivity, the image brightness can be improved. For example, by performing the integrating sphere brightness measurement on the wavelength-converting element 100 having the wavelength-converting layer using phosphor in glass as material and the diffuse reflection layer 130 of the embodiment of the invention and the wavelength-converting element having the wavelength-converting layer using phosphor in glass as material and the conventional diffuse reflection layer, the wavelength-converting element 100 of the embodiment of the invention can be improved by about 3% in brightness compared to the wavelength-converting element using the conventional diffuse reflection layer.

In summary, in the wavelength-converting element of the embodiment of the invention, the diffuse reflection layer includes an inorganic binder and diffuse reflection particles. The inorganic binder includes an alcohol-soluble inorganic binder or a water-soluble inorganic binder. Compared to the curing temperature of the conventional material which needs to be greater than 400° C., the curing temperature of the inorganic binder using the above formula is only 200° C. to 300° C., and therefore the diffuse reflection layer of the embodiment of the invention can reduce the fine pores generated by high temperature (>400° C.) sintering and the characteristics of easily adsorbing liquid, so that the reflectivity of the wavelength-converting element can be improved. Since the manufacturing method of the wavelength-converting element according to the embodiment of the invention uses the inorganic binder, the above-described wavelength-converting element can be manufactured. The projection apparatus according to the embodiment of the invention can increase the image brightness by using the above-described wavelength-converting element.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the invention as defined by the following claims. Moreover, no element and component in the disclosure is intended to be dedicated to the public regardless of whether the element or component is explicitly recited in the following claims.

What is claimed is:

1. A wavelength-converting element, comprising a substrate, a wavelength-converting layer and a diffusion reflection layer, wherein
the wavelength-converting layer is disposed above the substrate; and
the diffusion reflection layer is disposed between the substrate and the wavelength-converting layer, the diffusion reflection layer comprises an inorganic binder and a plurality of diffuse reflection particles, the plurality of diffuse reflection particles are mixed with the inorganic binder, and the inorganic binder comprises an alcohol-soluble inorganic binder or a water-soluble inorganic binder, wherein the inorganic binder has a hydroxyl group, wherein the wavelength-converting element further comprises an intermediate layer disposed between the substrate and the diffusion reflection layer, the intermediate layer is directly connected to the substrate and the diffusion reflection layer, and a material of the intermediate layer comprises a silica gel, an epoxy resin or a thermal conductive adhesive.

2. The wavelength-converting element according to claim 1, wherein the inorganic binder is the alcohol-soluble inorganic binder, and a component of the alcohol-soluble inorganic binder comprises a siloxane and a metal oxide.

3. The wavelength-converting element according to claim 1, wherein the inorganic binder is the water-soluble inorganic binder, and a component of the water-soluble inorganic binder comprises at least one of silica sol, phosphate.

4. The wavelength-converting element according to claim 1, wherein a thermal conductivity of the diffusion reflection layer is less than or equal to a thermal conductivity of the intermediate layer.

5. The wavelength-converting element according to claim 1, wherein a material of the plurality of diffuse reflection particles comprises at least one of titanium dioxide, silicon dioxide, aluminum oxide, boron nitride and zirconium dioxide.

6. The wavelength-converting element according to claim 1, wherein a width ratio of the diffusion reflection layer to the wavelength-converting layer in a direction parallel to the substrate is 0.7 to 1.5.

7. The wavelength-converting element according to claim 1, wherein the wavelength-converting layer comprises a phosphor in glass, a phosphor in ceramic, a polycrystalline fluorescent sheet, a monocrystalline fluorescent sheet or a phosphor in silicon.

8. The wavelength-converting element according to claim 1, wherein the wavelength-converting element is a wavelength-converting wheel, and the substrate is a turntable.

9. A projection apparatus, comprising: an illumination system, a light valve and a projection lens, wherein the illumination system is adapted to provide an illumination beam, the light valve is disposed on a transmission path of the illumination beam to convert the illumination beam into an image beam, the projection lens is disposed on a transmission path of the image beam, the illumination system comprises an exciting light source and a wavelength-converting element, wherein the exciting light source is adapted to provide an exciting beam, the wavelength-converting element is disposed on a transmission path of the exciting beam, a wavelength-converting layer of the wavelength-converting element is adapted to convert the exciting beam into a converted beam, the illumination beam comprises the converted beam, and the wavelength-converting element comprises a substrate, the wavelength-converting layer and a diffusion reflection layer, wherein the wavelength-converting layer is disposed above the substrate; and the diffusion reflection layer is disposed between the substrate and the wavelength-converting layer, the diffusion reflection layer comprises an inorganic binder and a plurality of diffuse reflection particles, the plurality of diffuse reflection particles are mixed with the inorganic binder, and the inorganic binder comprises an alcohol-soluble inorganic binder or a water-soluble inorganic binder, wherein the inorganic binder has a hydroxyl group, wherein the wavelength-converting element further comprises an intermediate layer disposed between the substrate and the diffusion reflection layer, the intermediate layer is directly connected to the substrate and the diffusion reflection layer, and a material of the intermediate layer comprises a silica gel, an epoxy resin or a thermal conductive adhesive.

* * * * *